United States Patent
Li (10) Patent No.: US 12,074,336 B2
(45) Date of Patent: Aug. 27, 2024

(54) POWER BANK

(71) Applicant: Wenjie Li, Guangzhou (CN)

(72) Inventor: Wenjie Li, Guangzhou (CN)

( * ) Notice: Subject to any disclaimer, the term of this patent is extended or adjusted under 35 U.S.C. 154(b) by 623 days.

(21) Appl. No.: 17/340,576

(22) Filed: Jun. 7, 2021

(65) Prior Publication Data
US 2022/0255178 A1 Aug. 11, 2022

(30) Foreign Application Priority Data
Feb. 10, 2021 (CN) .......................... 202110182615.0

(51) Int. Cl.
*H01M 50/264* (2021.01)
*H01M 10/04* (2006.01)
(Continued)

(52) U.S. Cl.
CPC ..... *H01M 50/264* (2021.01); *H01M 10/0481* (2013.01); *H01M 10/4257* (2013.01);
(Continued)

(58) Field of Classification Search
CPC ........... H01M 50/264; H01M 10/0481; H01M 10/4257; H01M 50/202; H01M 50/247; H01M 50/271; H01M 50/287; H01M 50/296; H01M 50/528; H01M 2010/4271; H01M 2220/30; H01M 10/46; H01R 12/727; H01R 13/17; H02J 7/0044;
(Continued)

(56) References Cited

U.S. PATENT DOCUMENTS

2006/0208695 A1 9/2006 Weinstein et al.
2010/0052609 A1* 3/2010 Daniel ................ H01M 50/213
702/63

(Continued)

FOREIGN PATENT DOCUMENTS

CN 202 696 183 U 1/2013
CN 203261069 U 10/2013
(Continued)

OTHER PUBLICATIONS

Espacenet machine translation of Li et al. (WO-2009094833-A1) (Year: 2009).*

*Primary Examiner* — Jonathan G Leong
*Assistant Examiner* — Katharine A Caughron
(74) *Attorney, Agent, or Firm* — Schmeiser, Olsen & Watts, LLP (57) ABSTRACT

A power bank includes a shell, a PCB board, a fastening unit, a positive electrode connector, a negative electrode connector, an elastic component and a battery installation area enclosed by the elastic component and the bottom of the fastening unit. The elastic component is used to fasten a battery in the battery installation area so that a positive electrode terminal of the battery is electrically connected to the positive electrode connector, and a negative electrode terminal of the battery is electrically connected to the negative electrode connector, and the positive electrode terminal and the negative electrode terminal of the battery are located at the same side. The power bank is small size and light weight, of which the battery is fastened via squeezing by an elastic component so as to replace the battery freely.

13 Claims, 10 Drawing Sheets

(51) Int. Cl.
| | |
|---|---|
| *H01M 10/42* | (2006.01) |
| *H01M 50/202* | (2021.01) |
| *H01M 50/247* | (2021.01) |
| *H01M 50/271* | (2021.01) |
| *H01M 50/287* | (2021.01) |
| *H01M 50/296* | (2021.01) |
| *H01M 50/528* | (2021.01) |
| *H01R 12/72* | (2011.01) |
| *H01R 13/17* | (2006.01) |
| *H02J 7/00* | (2006.01) |
| *H05K 1/18* | (2006.01) |
| *H05K 7/14* | (2006.01) |

(52) U.S. Cl.
CPC ....... *H01M 50/202* (2021.01); *H01M 50/247* (2021.01); *H01M 50/271* (2021.01); *H01M 50/287* (2021.01); *H01M 50/296* (2021.01); *H01M 50/528* (2021.01); *H01R 12/727* (2013.01); *H01R 13/17* (2013.01); *H02J 7/0044* (2013.01); *H02J 7/0045* (2013.01); *H05K 1/18* (2013.01); *H05K 7/1427* (2013.01); *H01M 2010/4271* (2013.01); *H01M 2220/30* (2013.01)

(58) Field of Classification Search
CPC ...... H02J 7/0045; H02J 7/342; H05K 7/1427; H05K 1/18
See application file for complete search history.

(56) References Cited

U.S. PATENT DOCUMENTS

| | | | |
|---|---|---|---|
| 2011/0104522 A1* | 5/2011 | Morita | H01M 50/213 429/7 |
| 2013/0052502 A1 | 2/2013 | Su et al. | |
| 2013/0343042 A1* | 12/2013 | Windom | F21L 4/005 362/183 |
| 2017/0092961 A1* | 3/2017 | Liaw | H01M 50/394 |
| 2018/0283622 A1 | 10/2018 | Weyand | |

FOREIGN PATENT DOCUMENTS

| | | | | |
|---|---|---|---|---|
| CN | 204300712 U | 4/2015 | | |
| CN | 204304493 U | 4/2015 | | |
| WO | WO-2009094833 A1 * | 8/2009 | ............ | H01M 10/44 |
| WO | WO-2015063995 A1 * | 5/2015 | ............ | H01M 2/105 |
| WO | 2016/185359 A1 | 11/2016 | | |

* cited by examiner

POWER BANK

CROSS REFERENCE TO RELATED APPLICATIONS

This application claims priority to Chinese Application No. CN202110182615.0, having a filing date of Feb. 10, 2021, the contents of which are hereby incorporated by reference.

FIELD OF TECHNOLOGY

The following relates to the technical field of portable chargers, in particular to a power bank.

BACKGROUND

A power bank is a portable charger that can be easily carried by individuals, with electric energy stored to charge other electrical appliances, especially in the occasions where there is no outlet in sight. The main components of a power bank include a battery used for electrical energy storage, a circuit for stabilizing output voltage (DC-DC converter), and most power banks include chargers for charging their built-in batteries.

On the one hand, most of the existing power banks use non-detachable batteries, while batteries have a certain service life which leads to the lack of replaceability. On the other hand, the existing power banks usually use standard batteries with positive and negative electrodes at both ends respectively. For a standard battery with a positive electrode and a negative electrode separated, it is usually necessary to make a cylinder body with a tail by conductive aluminum alloy or other metal materials, so as to lead out the positive and negative electrodes. As a result, its size, weight, and cost are all subject to certain restrictions.

SUMMARY

An aspect relates to a power bank whose weight and size are smaller than traditional power banks, of which the battery is fastened via squeezing by an elastic component so as to replace the battery freely.

The technical solution adopted in embodiments as follows:

A power bank, comprising:
a shell;
a PCB board arranged in the shell and disposed with a discharge circuit, at least one positive connection terminal and at least one negative connection terminal;
a fastening unit arranged in the shell and below the PCB board;
a positive electrode connector having a lower end arranged at a bottom of the fastening unit and an upper end passing through the fastening unit to electrically connect with the positive connection terminal;
a negative electrode connector having a lower end arranged at the bottom of the fastening unit and an upper end passing through the fastening unit to electrically connect with the negative connection terminal;
an elastic component having two ends fastened to the fastening unit respectively; and
a battery installation area enclosed and defined by the elastic component and the bottom of the fastening unit;
the elastic component is used to fasten a battery in the battery installation area so that a positive electrode terminal of the battery is electrically connected to the positive electrode connector, and a negative electrode terminal of the battery is electrically connected to the negative electrode connector, and the positive electrode terminal and the negative electrode terminal of the battery are located at the same side.

In some embodiments, the fastening unit comprises an upper pressing plate and a lower pressing plate fixed to each other from top to bottom, and the two ends of the elastic component are fixed between the upper pressing plate and the lower pressing plate respectively.

Furthermore, the upper pressing plate has a first groove and a second groove; a first end of the elastic component upwardly forms a first protrusion, and a second end of the elastic component upwardly forms a second protrusion; the first protrusion is plugged into the first groove, and the second protrusion is plugged into the second groove.

Furthermore, the first end of the elastic component downwardly forms a third protrusion, and the second end of the elastic component downwardly forms a fourth protrusion; the lower pressing plate has a ring wall, and the third protrusion and the fourth protrusion abut an inner side of the ring wall.

In some embodiments, the positive electrode connector is a contact pin; a center of the upper pressing plate has a first central opening, and a center of the lower pressing plate has a second central opening; the contact pin is connected with the positive connection terminal through the first central opening and the second central opening.

Furthermore, a bottom of the PCB board has a third groove with an opening direction downward, and the positive connection terminal is arranged at the top of the third groove; an upper end of a body of the contact pin is disposed with a contact part, and a diameter of the contact part is smaller than a diameter of the body of the contact pin and a width of the third groove; the body of the contact pin is sleeved with a spring, and the contact part is sleeved with a limiting piece for limiting the spring;
when the battery is fastened in the battery installation area, the positive electrode terminal of the battery extrudes the contact pin upward, so that the contact part enters the third groove to electrically connect to the positive connection terminal.

In some embodiments, the negative electrode connector comprises an annular metal sheet arranged between the upper pressing plate and the lower pressing plate;
two sides of a bottom of the annular metal sheet are oppositely disposed with a first contact column and a second contact column, and two sides of a top of the ring metal sheet are oppositely disposed with a first lead-out sheet and a second lead-out sheet;
the lower pressing plate has a first conveying hole for the first contact column to pass through and a second conveying hole for the second contact column to pass through;
the first contact column and the second contact column pass through the first conveying hole and the second conveying hole respectively to connect with the negative electrode terminal of the battery;
the first lead-out sheet and the second lead-out sheet pass through the first lead-out hole and the second lead-out hole respectively to connect with the negative connection terminal.

In some embodiments, the upper pressing plate comprises a slot and two clamping parts, and two positioning slots matched with the clamping parts are disposed on both sides of the PCB board; the bottom of the PCB board is inserted into the slot, and the clamping parts are clamped to the positioning slots.

In some embodiments, the lower pressing plate has four first thread holes, the upper pressing plate has four concave parts corresponding to the four first thread holes, and an inner wall of the shell has four second thread holes corresponding to the four first thread holes.

In some embodiments, the PCB board is equipped with at least one output port, and the shell has at least one opening for accommodating the output port accordingly;

the output port is one or more kinds of a micro-USB port, a mini-USB port, a Type-C port, a Dock port and a Lighting port.

The power bank provided by the disclosure is small size and light weight, of which the battery is fastened via squeezing by an elastic part so as to replace the battery freely according to needs. Besides being used as a portable charger, it can also be used as a battery charger, which has greater convenience and superiority.

For the sake of a better understanding and implementation, embodiments of the disclosure are detailed below in combination with the accompanying drawings.

BRIEF DESCRIPTION

Some of the embodiments will be described in detail, with reference to the following figures, wherein like designations denote like members, wherein.

Reference numerals in the Figures: 10—shell, 12—opening, 13—raised lines, 20—PCB board, 21—positioning slots, 22—third groove, 23—output port, 24—positive connection terminal, 25—negative connection terminal, 26—discharge circuit, 30—fastening unit, 31—lower pressing plate, 311—ring wall, 312—first thread hole, 313—first locating column, 314—second locating column, 315—second central opening, 316—first conveying hole, 317—second conveying hole, 32—upper pressing plate, 321—first groove, 322—second groove, 323—first locating hole, 324—second locating hole, 325—first central opening, 326—first clamping part, 327—second clamping part, 328—slot, 329—first lead-out hole, 330—second lead-out hole, 331—concave parts, 40—positive electrode connector, 41—annular flange, 42—contact part, 50—negative electrode connector, 51—first contact column, 52—second contact column, 53—first lead-out sheet, 54—second lead-out sheet, 55—hole, 56—hole, 60—elastic unit, 61—battery installation area, 62—first end, 621—first protrusion, 63—second end, 631—second protrusion, 622—third protrusion, 632—fourth protrusion, 70—battery, 71—positive electrode terminal, 72—negative electrode terminal, 80—spring, 90—limiting piece.

DETAILED DESCRIPTION

In the description of the disclosure, it is to be understood that terms "the center", "vertical", "horizontal" and "up", "down", "upper" and "lower", "left", "right" and "vertical", "horizontal", "top", "bottom", "inside" and "outside" indicate locations or positions relationship based on the locations or positions shown in the appended Figures, only for facilitating or simplifying the description of this disclosure, rather than indicating or implying that the pointed device or element must have a specific orientation, be constructed and operated in a specific orientation, and therefore cannot be interpreted as limiting the application.

Figure 1:
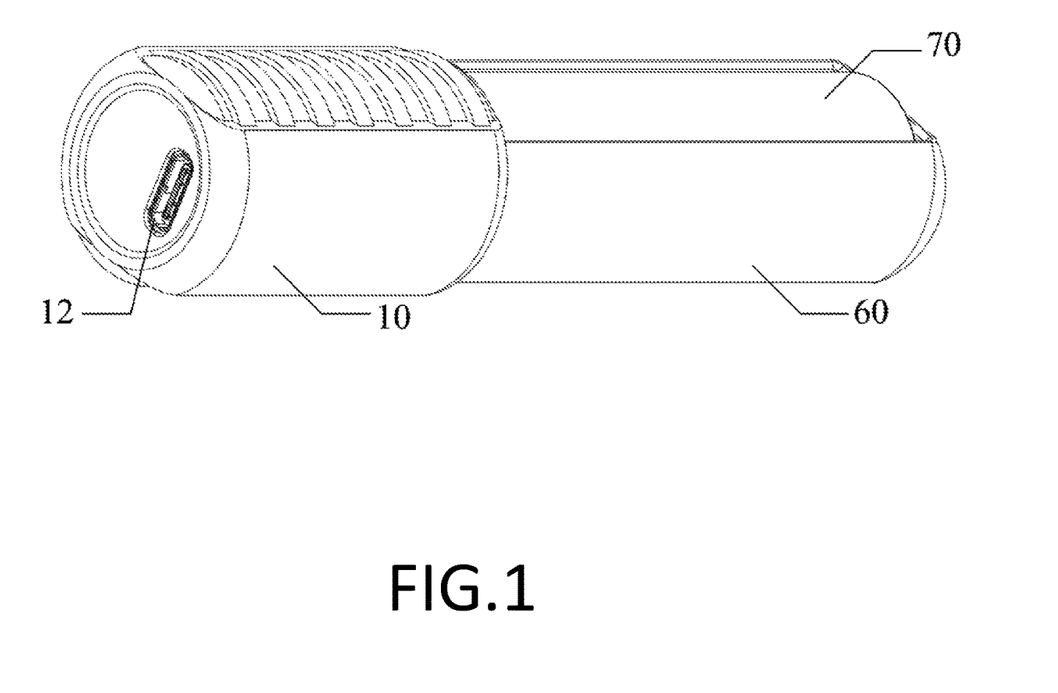
FIG. 1 is an overall schematic view of a power bank according to one or more embodiments.
Figure 2:
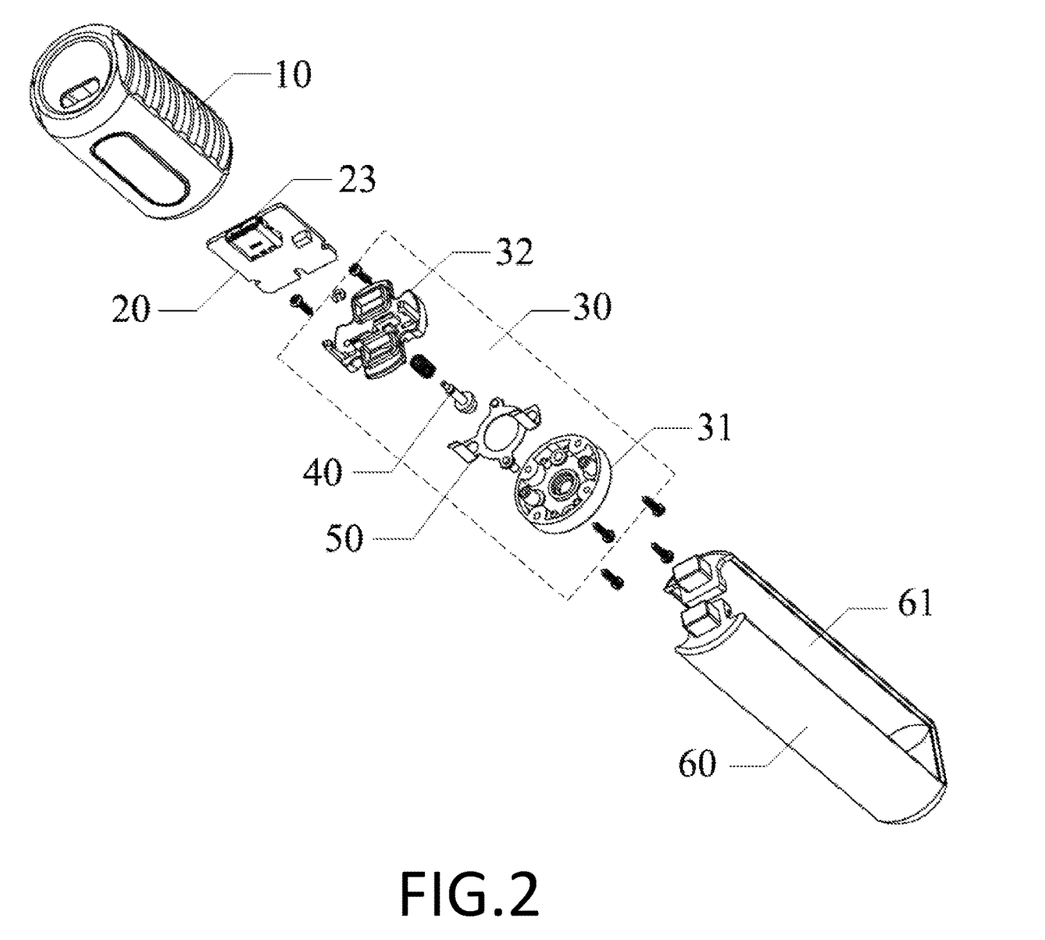
FIG. 2 is an exploded view of a power bank according to one or more embodiments.

Referring to FIG. 1 and FIG. 2, a power bank provided by the disclosure includes a shell 10, a PCB board 20 arranged in the shell 10, a fastening unit 30, a positive electrode connector 40, a negative electrode connector 50 and an elastic component 60.

As the main circuit board of the power bank, the PCB board 20 is provided with a discharge circuit 26 (indicated by dotted lines in FIG. 8), at least one positive connection terminal 24, at least one negative connection terminal 25 and an output port 23, wherein the positive connection terminal 24, the negative connection terminal 25 and the output port 23 are connected to the discharge circuit 26 respectively. The discharge circuit 26 is used to connect with a positive electrode terminal and a negative electrode terminal of a battery 70 through the positive connection terminal 24 and the negative connection terminal 25, so as to discharge through the output port 23. In some embodiments, the PCB board may be provided with a charge and discharge circuit. In some embodiments, the output port 23 on the PCB board 20 is a Type-C port. In other embodiments, the output port may be other kinds of ports, such as a micro-USB interface, a mini-USB port, a Dock port and a lighting port, etc.

As shown in FIG. 1, the shell 10 has an opening 12 for accommodating the output port 23.

The fastening unit 30 is arranged below the PCB board 20, two ends of the elastic component 60 are fastened to the fastening unit 30 respectively, and the elastic component 60 is enclosed with the bottom of the fastening unit 30 to form a battery installation area 61.

A lower end of the positive electrode connector 40 is arranged at the bottom of the fastening unit 30, and an upper end of the positive electrode connector 40 passes through the fastening unit 30 to connect the positive connection terminal 24 of the PCB board 20. The lower end of the negative electrode connector is arranged at the bottom of the fastening unit 30, and the upper end of the negative electrode connector 50 passes through the fastening unit 30 to connect the negative connection terminal 25 of the PCB board 20.

Figure 10:
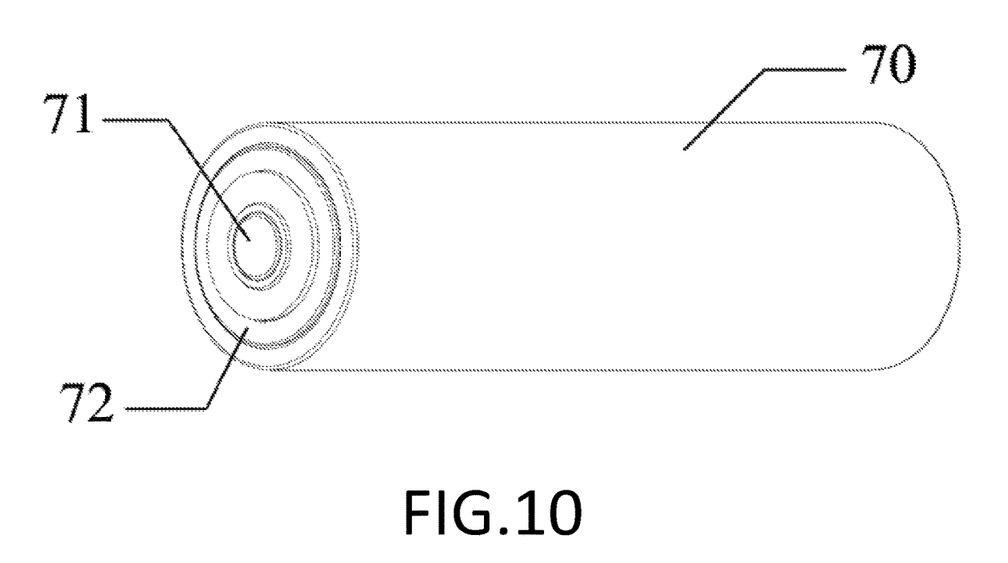
FIG. 10 is a schematic structural diagram of a battery used by a power bank according to one or more embodiments.

The elastic component 60 is used to fasten the battery 70 in the battery installation area 61 so that the positive electrode terminal of the battery 70 is connected to the positive electrode connector 40, and the negative electrode terminal of the battery 70 is connected to the bottom of the negative electrode connector 50, wherein, as shown in FIG. 10, the positive electrode terminal 71 and the negative electrode terminal 72 of the battery 70 are located at the same side, that is, both the positive electrode terminal 71 and the negative electrode terminal 72 of the battery 70 are fastened at the bottom of the fastening unit 30. In this embodiment, the elastic component 60 may be a rubber band or other elastic components with elastic function.

In this embodiment, the power bank uses the battery with positive electrode terminal and negative electrode terminal on the same side and the elastic component 60 to fasten the battery, which reduces the overall size and weight of the power bank. In addition, the battery is detachably installed in the battery installation area 61 formed by the elastic component 60 and the fastening unit 30, so that the battery can be freely replaced according to actual needs, which increases convenience in use.

The structure of the fastening unit 30 and the fixing manner between the fastening unit 30 and the elastic component 60 can be implemented in various specific ways. In some embodiments, referring to FIG. 2, the fastening unit 30 includes an upper pressing plate 32 and a lower pressing plate 31 fixed to each other from top to bottom, and the two ends of the elastic component 60 are fixed between the upper pressing plate 32 and the lower pressing plate 31 respectively.

Referring to FIG. 3-6, the upper pressing plate 32 has a first groove 321 and a second groove 322. A first end 62 of the elastic component 60 upwardly forms a first protrusion 621, and a second end 63 of the elastic component 60 upwardly forms a second protrusion 631. When fixing the elastic component 60 between the upper pressing plate 32 and the lower pressing plate 31, the first protrusion 621 is plugged into the first groove 321 and the second protrusion 631 is plugged into the second groove 322, thus fixing the elastic component 60.

Figure 4:
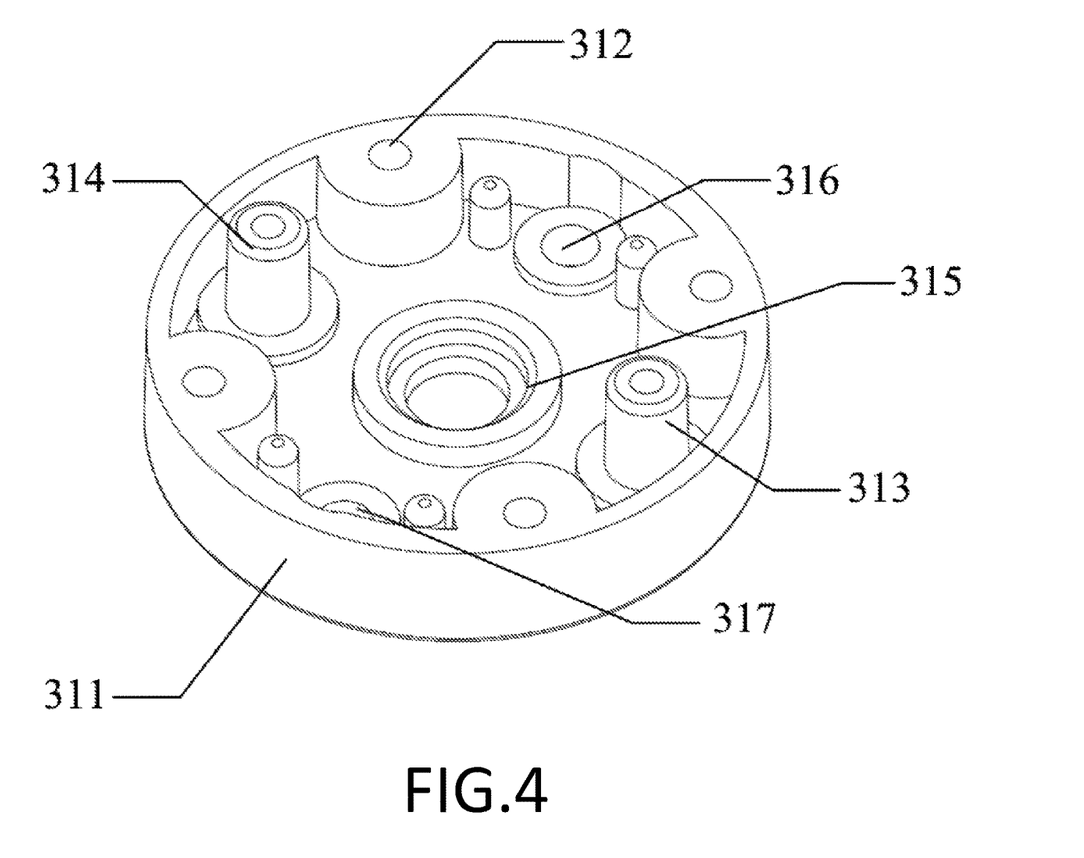
FIG. 4 is a schematic structural diagram of a lower pressing plate according to one or more embodiments.
Figure 5:
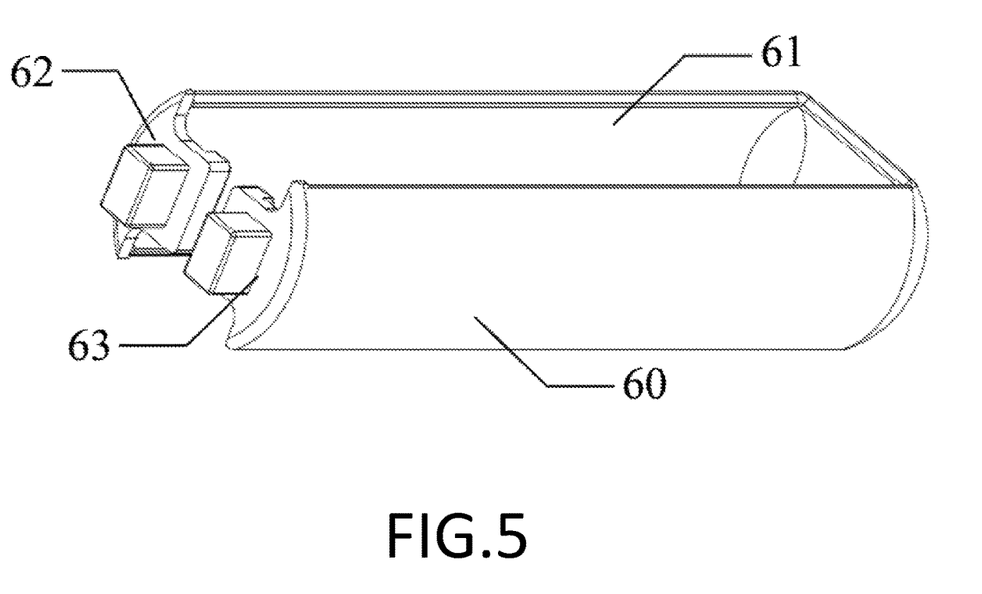
FIG. 5 is a schematic structural diagram of an elastic component according to one or more embodiments.
Figure 6:
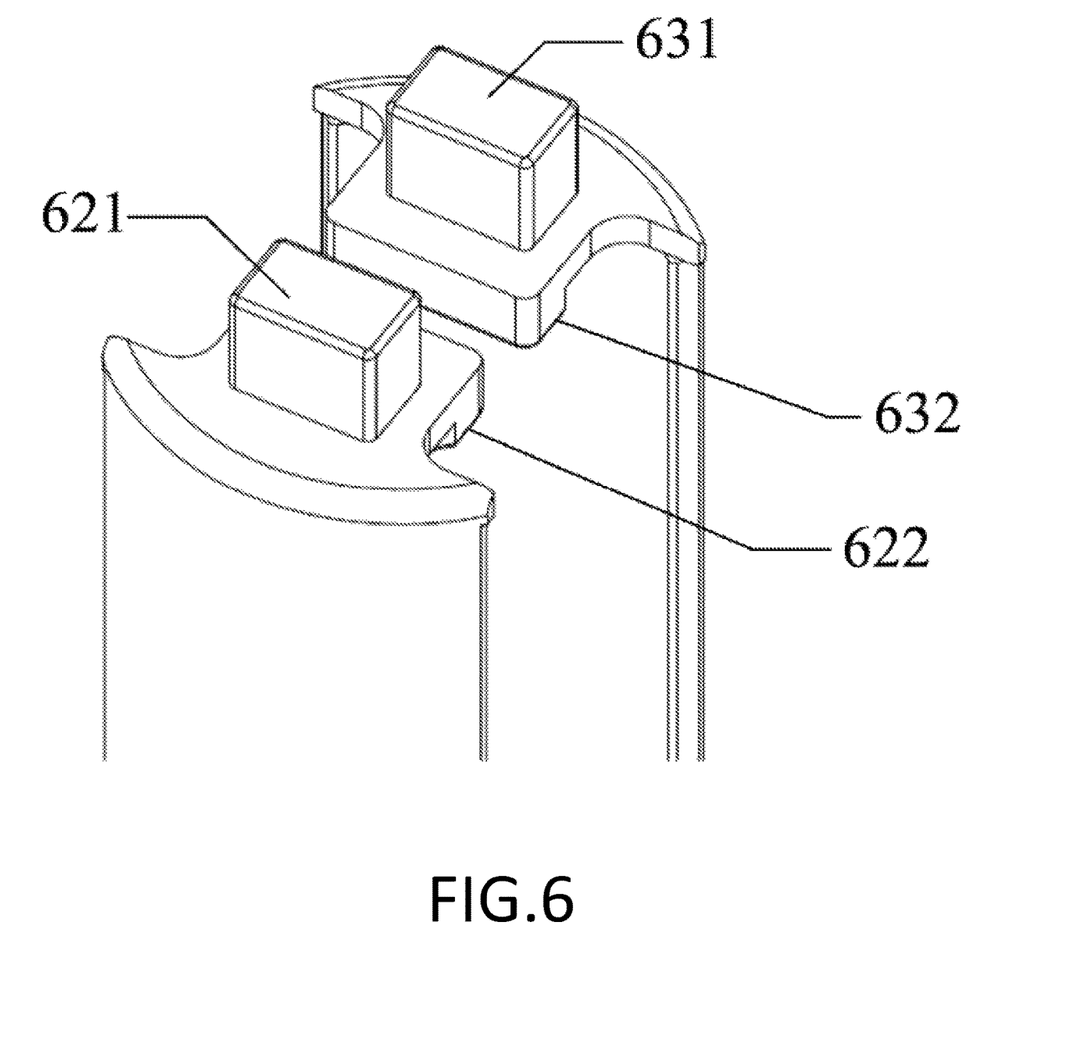
FIG. 6 is a partial enlarged view of the elastic component according to one or more embodiments.

Referring to FIG. 5 and FIG. 6, the first end 62 of the elastic component 60 downwardly forms a third protrusion 622, and the second end 63 of the elastic component 60 downwardly forms a fourth protrusion 632. The lower pressing plate 31 has a ring wall 311, as shown in FIG. 4. When fixing the elastic component 60 between the upper pressing plate 32 and the lower pressing plate 31, the third protrusion 622 and the fourth protrusion 632 abut the inner side of the ring wall 311, thereby the elastic component 60 is clamped between the upper pressing plate 32 and the lower pressing plate 31 from the upper and lower directions.

In use, when a battery is placed in the battery installation area 61 enclosed by the elastic component 60 and the fastening unit 30, the battery squeezes the elastic component 60. Under the elastic force of the elastic component 60, and because the first end 62 and the second end 63 of the elastic component 60 are clamped between the upper pressing plate 32 and the lower pressing plate 31, the battery is fully reliably wrapped and supported.

There may be various specific implementations to fasten the upper pressing plate 32 and the lower pressing plate 31. In some embodiments, referring to FIG. 4, the lower pressing plate 31 is provided with a first locating column 313 and a second locating column 314, which are both internally provided with threaded holes; referring to FIG. 3, the upper pressing plate 32 is correspondingly has a first locating hole 323 and a second locating hole 324. Referring to FIG. 2, two screws pass through the first locating hole 323 and the second locating hole 324 respectively, which are screwed into the threaded holes of the first locating column 313 and the second locating column 314 respectively, fastening the upper pressing plate 32 and the lower pressing plate 31.

There are various embodiments for the specific structure of the positive electrode connector 40. In some embodiments, referring to FIG. 7, the positive electrode connector 40 is a contact pin, and the middle and lower part of the contact pin is provided with an annular flange 41.

Figure 3:
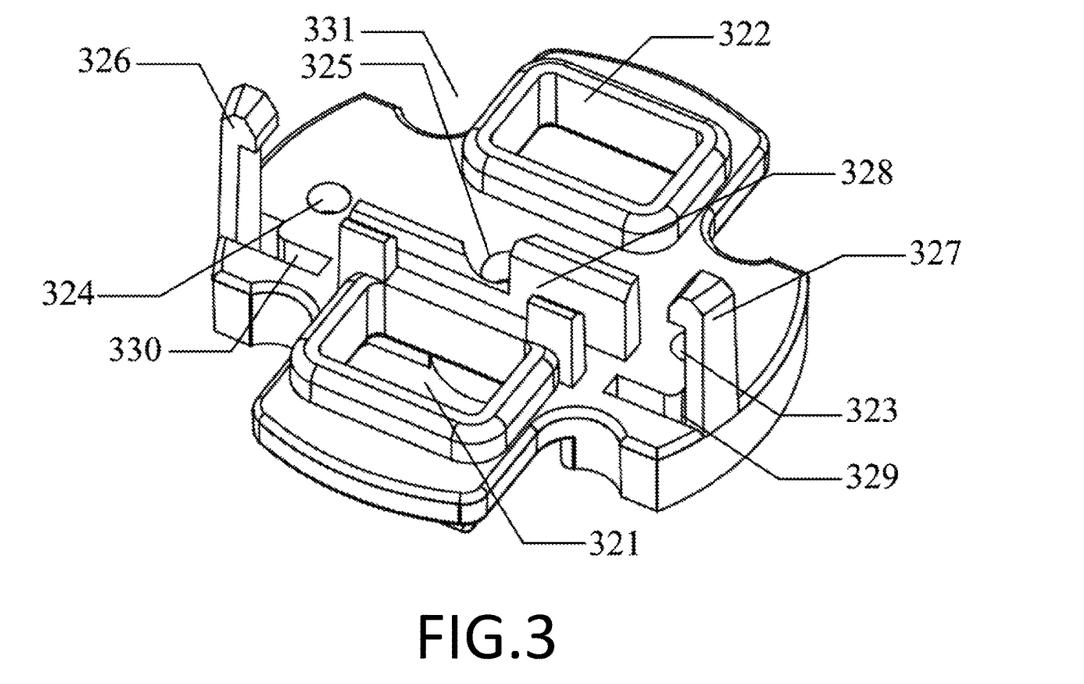
FIG. 3 is a schematic structural diagram of an upper pressing plate according to one or more embodiments.

Referring to FIG. 3 and FIG. 4 simultaneously, the center of the upper pressing plate 32 is provided with a first central opening 325, and the center of the lower pressing plate 31 is provided with a second central opening 315. The diameters of the first central opening 325 and the second central opening 315 are larger than the diameter of the body of the contact pin 40 but smaller than the diameter of the annular flange 41, therefore the contact pin 40 can insert into the second central opening 315 and the first central opening 325.

Figure 7:
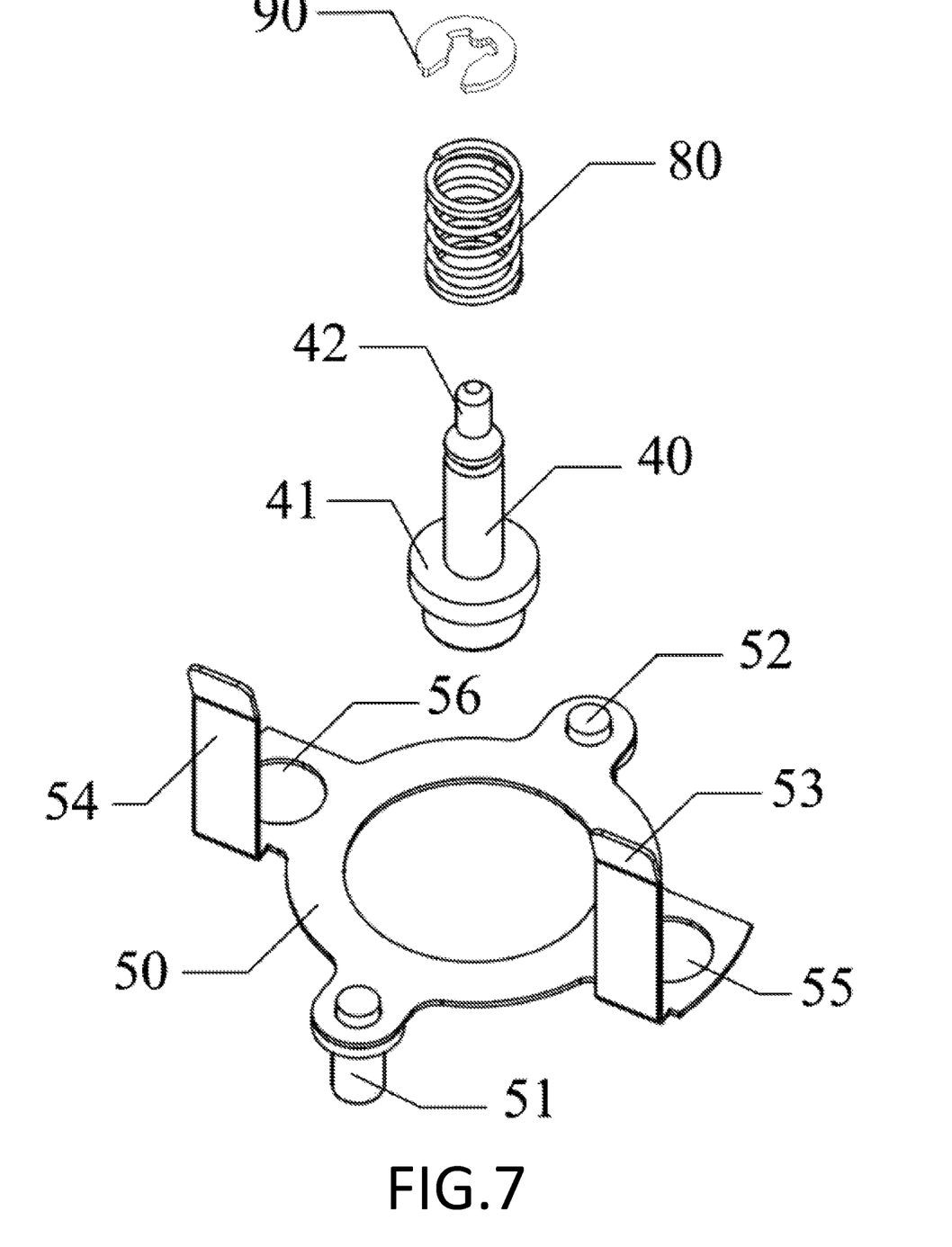
FIG. 7 is a schematic structural diagram of a positive electrode connector and a negative electrode connector according to one or more embodiments.
Figure 8:
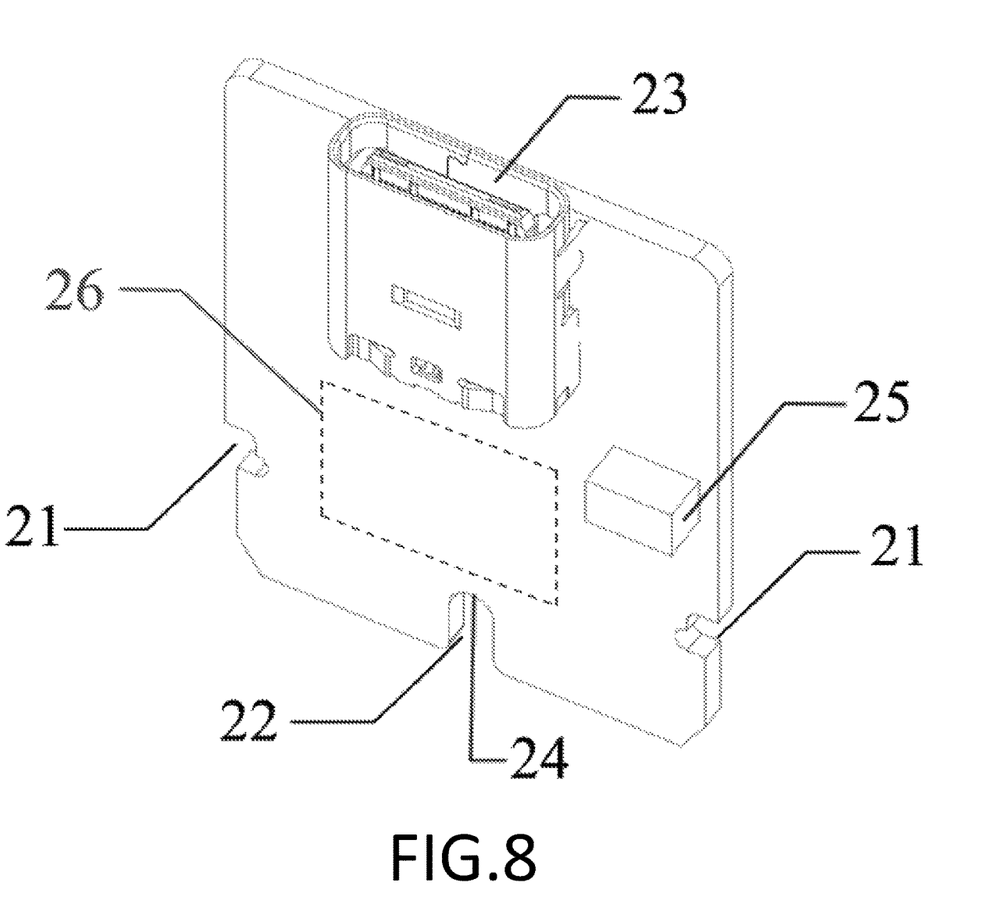
FIG. 8 is a schematic structural diagram of a PCB board according to one or more embodiments.

In some embodiments, as shown in FIG. 8, the bottom of the PCB board 20 is provided with a third groove 22, of which the opening direction is downward, and the positive connection terminal 24 is arranged at the top of the third groove 22. As shown in FIG. 7, the upper end of the body of the contact pin 40 is provided with a contact part 42. The diameter of the contact part 42 is smaller than the diameter of the body of the contact pin 40, and is smaller than the width of the third groove 22.

Further, the body of the contact pin 40 is sleeved with a spring 80, and the contact part 42 is sleeved with a limiting piece 90 for limiting the spring 80. The limiting piece 90 sets on the contact part 42, and the aperture of the limiting piece 90 is smaller than the width of the spring 70, as shown in FIG. 7.

When the battery 70 is fastened in the battery installation area 61, the positive electrode terminal of the battery 70 extrudes the contact pin 40 upward, so that the contact pin 40 overcomes the resistance of the spring 80, and the contact part 42 enters the third groove 22 to electrically connect to the positive connection terminal 24 of the PCB board 20.

In this embodiment, the spring 80 is clamped between the annular flange 41 of the contact pin 40 and the upper pressing plate 32, which can ensure effective contact between the contact pin 40 and the positive electrode terminal 71 of the battery 70 and between the contact pin 40 and the positive connection terminal 24 of the PCB board 20.

There are various embodiments for the specific structure of the negative electrode connector 50. In some embodiments, referring to FIG. 2 and FIG. 7, the negative electrode connector 50 includes an annular metal sheet, and the annular metal sheet is arranged between the upper pressing plate 32 and the lower pressing plate 31.

Two sides of the bottom of the annular metal sheet are oppositely provided with a first contact column 51 and a second contact column 52, and two sides of the top of the ring metal sheet are oppositely provided with a first lead-out sheet 53 and a second lead-out sheet 54. The annular metal sheet also has two holes 55 and 56, the two screws passing through the locating holes 323 and 324 respectively pass through the two holes 55 and 56, and then enter into the threaded holes of the locating columns 313 and 314 respectively.

The upper pressing plate 32 is provided accordingly with a first lead-out hole 329 for the first lead-out sheet 53 to pass through, and a second lead-out hole 330 for the second lead-out sheet 54 to pass through; the lower pressing plate 31 is provided accordingly with a first conveying hole 316 for the first contact column 51 to pass through, and a second conveying hole 317 for the second contact column 52 to pass through.

The first contact column 51 and the second contact column 52 pass through the first conveying hole 316 and the second conveying hole 317 respectively to connect the negative electrode terminal 72 of the battery 70.

The first lead-out sheet 53 and the second lead-out sheet 54 pass through the first lead-out hole 329 and the second lead-out hole 330 respectively to connect to two negative connection terminals 25 arranged on the side surface of the PCB board 20.

The connection between PCB board 20 and the fastening unit 30 can be implemented in a variety of ways. In some embodiments, referring to FIG. 3, the upper pressing plate 32 is provided with a slot 328, a first clamping part 326 and a second clamping part 327 which are opposite to each other. Referring to FIG. 8, two positioning slots 21 are provided on both sides of the PCB board 20 respectively to be clipped by the first clamping part 326 and the second clamping part 327. During installation, the bottom of the PCB board 20 is inserted into the slot 328, and the first clamping part 326 and the second clamping part 327 are clamped to the positioning slots 21 on both sides of the PCB board 20 respectively.

In some embodiments, the battery 70 applicable to the power bank may be a disposable battery or a rechargeable battery.

In some embodiments, the power bank also includes at least one indicator light arranged on the surface of the shell 10, which is connected with the PCB board 20 to indicate the working state of the battery. In an embodiment, the indicator light is an LED light.

The connection between the shell 10 and the fastening unit 30 can be implemented in a variety of ways. In some embodiments, referring to FIG. 3 and FIG. 4, the lower pressing plate 31 is provided with four first thread holes 312, the upper pressing plate 32 is provided with four concave parts 331 along the edge, the inner wall of the shell 10 is provided with four connecting elements (not shown in the figures), and the four connecting elements are provided with four second thread holes corresponding to the four first thread holes 312. The positions of the first thread holes 312, the concave parts 331 and the second thread holes are aligned, and threads of the first thread holes 312 and threads of the second thread holes are matched. During installation, as shown in FIG. 2, four screws are used to pass through the four first thread holes 312 of the lower pressing plate 31 and the four concave parts 331 of the upper pressing plate 32 respectively, and finally screw into the second thread holes in the inner wall of the shell 10, thereby to fix the lower pressing plate 31 and the upper pressing plate 32 within the shell 10.

Figure 9:
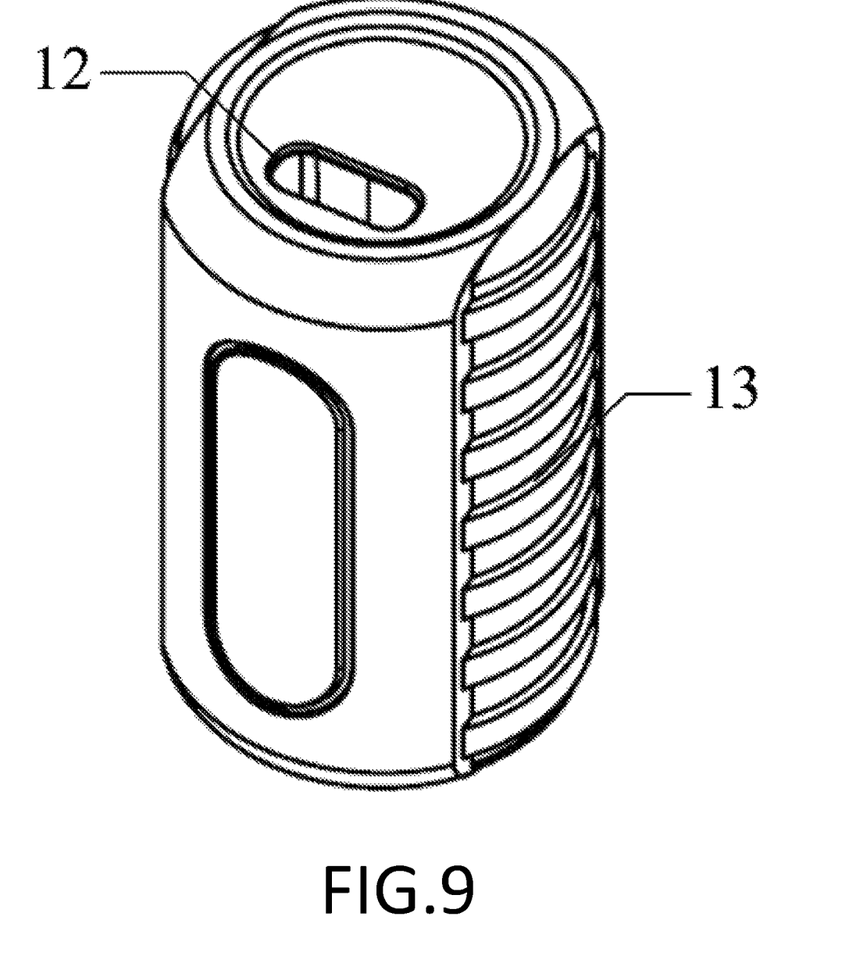
FIG. 9 is a schematic structural diagram of a shell of a power bank according to one or more embodiments.

In some embodiments, referring to FIG. 9, the outer surface of the shell 10 is provided with multiple raised lines 13, which play a role in improving the sense of touch and anti-skid.

The power bank provided by the disclosure is small size and light weight, of which the battery is fastened via squeezing by an elastic component so as to replace the battery freely according to needs. Besides being used as a portable charger, it can also be used as a battery charger, which has greater convenience and superiority.

Although the present invention has been disclosed in the form of preferred embodiments and variations thereon, it will be understood that numerous additional modifications and variations could be made thereto without departing from the scope of the invention.

For the sake of clarity, it is to be understood that the use of 'a' or 'an' throughout this application does not exclude a plurality.

What is claimed:

1. A power bank, comprising:
a shell;
a PCB board arranged in the shell and disposed with a discharge circuit, at least one positive connection terminal and at least one negative connection terminal;
a fastening unit arranged in the shell and below the PCB board, wherein the fastening unit comprises an upper pressing plate and a lower pressing plate fixed to each other from top to bottom;
a positive electrode connector having a lower end arranged at a bottom of the fastening unit and an upper end passing through the fastening unit to electrically connect with the positive connection terminal;
a negative electrode connector having a lower end arranged at the bottom of the fastening unit and an upper end passing through the fastening unit to electrically connect with the negative connection terminal, wherein the negative electrode connector comprises an annular metal sheet arranged between the upper pressing plate and the lower pressing plate;
two sides of a bottom of the annular metal sheet are oppositely disposed with a first contact column and a second contact column, and two sides of a top of the annular metal sheet are oppositely disposed with a first lead-out sheet and a second lead-out sheet;
the lower pressing plate has a first conveying hole for the first contact column to pass through and a second conveying hole for the second contact column to pass through;
the first contact column and the second contact column pass through the first conveying hole and the second conveying hole respectively to connect with the negative electrode terminal of the battery; the first lead-out sheet and the second lead-out sheet pass through the first lead-out hole and the second lead-out hole respectively to connect with the negative connection terminal;
an elastic component having two ends fastened between the upper pressing plate and the lower pressing plate respectively; and
a battery installation area enclosed and defined by the elastic component and the bottom of the fastening unit; wherein the elastic component is used to fasten a battery in the battery installation area so that a positive electrode terminal of the battery is electrically connected to the positive electrode connector, and a negative electrode terminal of the battery is electrically connected to the negative electrode connector, and the positive electrode terminal and the negative electrode terminal of the battery are located at the same side.

2. The power bank of claim 1, wherein the upper pressing plate has a first groove and a second groove; a first end of the elastic component upwardly forms a first protrusion, and a second end of the elastic component upwardly forms a second protrusion; the first protrusion is plugged into the first groove, and the second protrusion is plugged into the second groove.

3. The power bank of claim 2, wherein the first end of the elastic component downwardly forms a third protrusion, and the second end of the elastic component downwardly forms a fourth protrusion; the lower pressing plate has a ring wall, and the third protrusion and the fourth protrusion abut an inner side of the ring wall.

4. The power bank of claim 1, wherein the positive electrode connector is a contact pin; a center of the upper pressing plate has a first central opening, and a center of the lower pressing plate has a second central opening; the contact pin is connected with the positive connection terminal through the first central opening and the second central opening.

5. The power bank of claim 4, wherein a bottom of the PCB board has a third groove with an opening direction downward, and the positive connection terminal is arranged at the top of the third groove; an upper end of a body of the contact pin is disposed with a contact part, and a diameter of the contact part is smaller than a diameter of the body of the contact pin and a width of the third groove; the body of the contact pin is sleeved with a spring, and the contact part is sleeved with a limiting piece for limiting the spring;

when the battery is fastened in the battery installation area, the positive electrode terminal of the battery extrudes the contact pin upward, so that the contact part enters the third groove to electrically connect to the positive connection terminal.

6. The power bank of claim 2, wherein the positive electrode connector is a contact pin; a center of the upper pressing plate has a first central opening, and a center of the lower pressing plate has a second central opening; the contact pin is connected with the positive connection terminal through the first central opening and the second central opening.

7. The power bank of claim 6, wherein a bottom of the PCB board has a third groove with an opening direction downward, and the positive connection terminal is arranged at the top of the third groove; an upper end of a body of the contact pin is disposed with a contact part, and a diameter of the contact part is smaller than a diameter of the body of the contact pin and a width of the third groove; the body of the contact pin is sleeved with a spring, and the contact part is sleeved with a limiting piece for limiting the spring;

when the battery is fastened in the battery installation area, the positive electrode terminal of the battery extrudes the contact pin upward, so that the contact part enters the third groove to electrically connect to the positive connection terminal.

8. The power bank of claim 1, wherein the upper pressing plate comprises a slot and two clamping parts, and two positioning slots matched with the clamping parts are disposed on both sides of the PCB board; the bottom of the PCB board is inserted into the slot, and the clamping parts are clamped to the positioning slots.

9. The power bank of claim 1, wherein the lower pressing plate has four first thread holes, the upper pressing plate has four concave parts corresponding to the four first thread holes, and an inner wall of the shell has four second thread holes corresponding to the four first thread holes.

10. The power bank of claim 1, wherein the PCB board is equipped with at least one output port, and the shell has at least one opening for accommodating the output port accordingly.

11. The power bank of claim 10, wherein the output port is one or more kinds of a micro-USB port, a mini-USB port, a Type-C port, a Dock port and a Lighting port.

12. The power bank of claim 1, wherein the PCB board is equipped with at least one output port, and the shell has at least one opening for accommodating the output port accordingly.

13. A power bank, comprising:
a shell;
a PCB board arranged in the shell and disposed with a discharge circuit, at least one positive connection terminal and at least one negative connection terminal;
a fastening unit arranged in the shell and below the PCB board;
a positive electrode connector having a lower end arranged at a bottom of the fastening unit and an upper end passing through the fastening unit to electrically connect with the positive connection terminal;
a negative electrode connector having a lower end arranged at the bottom of the fastening unit and an upper end passing through the fastening unit to electrically connect with the negative connection terminal;
an elastic component having two ends fastened; and
a battery installation area enclosed and defined by the elastic component and the bottom of the fastening unit;
wherein the elastic component is used to fasten a battery in the battery installation area so that a positive electrode terminal of the battery is electrically connected to the positive electrode connector, and a negative electrode terminal of the battery is electrically connected to the negative electrode connector, and the positive electrode terminal and the negative electrode terminal of the battery are located at the same side;
wherein the fastening unit comprises an upper pressing plate and a lower pressing plate fixed to each other from top to bottom, and the two ends of the elastic component are fixed between the upper pressing plate and the lower pressing plate respectively;
wherein the upper pressing plate has a first groove and a second groove; a first end of the elastic component upwardly forms a first protrusion, and a second end of the elastic component upwardly forms a second protrusion; the first protrusion is plugged into the first groove, and the second protrusion is plugged into the second groove;
wherein the negative electrode connector comprises an annular metal sheet arranged between the upper pressing plate and the lower pressing plate;
two sides of a bottom of the annular metal sheet are oppositely disposed with a first contact column and a second contact column, and two sides of a top of the annular metal sheet are oppositely disposed with a first lead-out sheet and a second lead-out sheet;
the lower pressing plate has a first conveying hole for the first contact column to pass through and a second conveying hole for the second contact column to pass through;
the first contact column and the second contact column pass through the first conveying hole and the second conveying hole respectively to connect with the negative electrode terminal of the battery; the first lead-out sheet and the second lead-out sheet pass through the first lead-out hole and the second lead-out hole respectively to connect with the negative connection terminal.

* * * * *